(12) United States Patent
Collins et al.

(10) Patent No.: US 11,489,219 B2
(45) Date of Patent: *Nov. 1, 2022

(54) ENCAPSULATING IN-SITU ENERGY STORAGE DEVICE WITH ELECTRODE CONTACT

(71) Applicant: International Business Machines Corporation, Armonk, NY (US)

(72) Inventors: John Collins, Tarrytown, NY (US); Devendra K. Sadana, Pleasantville, NY (US); Bucknell C. Webb, Ossining, NY (US); Paul S. Andry, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/445,185

(22) Filed: Jun. 18, 2019

(65) Prior Publication Data
US 2020/0403190 A1 Dec. 24, 2020

(51) Int. Cl.
*H01M 50/10* (2021.01)
*H01M 4/505* (2010.01)
(Continued)

(52) U.S. Cl.
CPC .......... *H01M 50/10* (2021.01); *H01L 23/564* (2013.01); *H01L 23/58* (2013.01); *H01M 4/505* (2013.01);
(Continued)

(58) Field of Classification Search
CPC combination set(s) only.
See application file for complete search history.

(56) References Cited

U.S. PATENT DOCUMENTS

| 5,766,799 A * | 6/1998 | Hong ................ H01M 10/345 429/218.2 |
| 6,099,114 A | 8/2000 | Sasaki |

(Continued)

FOREIGN PATENT DOCUMENTS

| WO | WO2011156419 A2 | 12/2011 |
| WO | WO2017/093074 | 11/2016 |

OTHER PUBLICATIONS

"Latest advances in the manufacturing of 3D rechargeable lithium microbatteries", Stefania Ferrari, et al. Journal of Power Sources 286 (2015) 25-46, WMG, University of Warwick, CV4 &AL Coventry, UK.

(Continued)

*Primary Examiner* — Ula C Ruddock
*Assistant Examiner* — Sarika Gupta
(74) *Attorney, Agent, or Firm* — Daniel P. Morris; Lou Percello, Attorney, PLLC

(57) ABSTRACT

An energy storage device sits within a trench with electrically insulated sides within a substrate. Within the trench there is an anode, an electrolyte disposed on the anode, and a cathode structure disposed on the electrolyte. Variations of an electrically conductive contact are disposed on and in electrical contact with the cathode structure. At least part of the conductive contact is disposed within the trench and the conductive contact partially seals the anode, electrolyte, and cathode structure within the trench. Conductive and/or non-conductive adhesives are used to complete the seal thereby enabling full working electrochemical devices where singulation of the devices from the substrate enables high control of device dimensionality and footprint.

12 Claims, 13 Drawing Sheets

(51) Int. Cl.
*H01M 10/0565* (2010.01)
*H01L 23/58* (2006.01)
*H01L 23/00* (2006.01)
*H01M 50/116* (2021.01)
*H01M 50/172* (2021.01)
*H01M 50/531* (2021.01)

(52) U.S. Cl.
CPC ..... *H01M 10/0565* (2013.01); *H01M 50/116* (2021.01); *H01M 50/172* (2021.01); *H01M 50/531* (2021.01); *H01M 2300/0082* (2013.01)

(56) References Cited

U.S. PATENT DOCUMENTS

| | | | |
|---|---|---|---|
| 7,368,332 | B2 | 5/2008 | Moriwaki et al. |
| 8,889,295 | B2 | 11/2014 | Yushin et al. |
| 9,312,561 | B2 | 4/2016 | Oukassi et al. |
| 9,929,438 | B2 | 3/2018 | Karlovsky et al. |
| 10,069,170 | B2 | 9/2018 | Ladroue et al. |
| 2011/0183186 | A1 | 7/2011 | Klootwijk et al. |
| 2013/0252104 | A1* | 9/2013 | Jo ............... H01M 4/525 429/219 |
| 2014/0308574 | A1 | 10/2014 | Ensling et al. |
| 2015/0084157 | A1* | 3/2015 | Tegen ............. H01M 6/40 257/528 |
| 2015/0207171 | A1 | 7/2015 | Chang et al. |
| 2017/0098823 | A1 | 4/2017 | Yushin et al. |
| 2017/0104224 | A1 | 4/2017 | Hahn |
| 2018/0076452 | A1* | 3/2018 | Sasaki ............. C03C 3/321 |

OTHER PUBLICATIONS

U.S. Appl. No. 17/366,521, filed Jul. 2, 2021 and any related art cited in this Application.
Appendix P.

\* cited by examiner

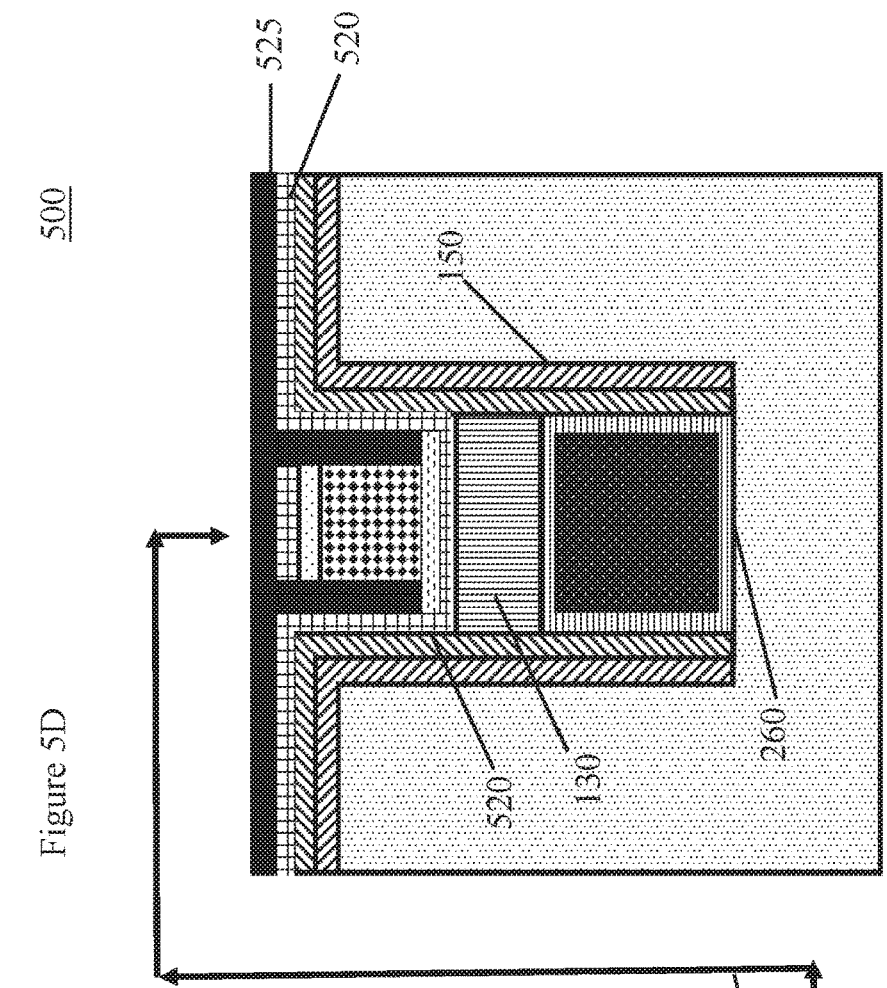
Figure 5D
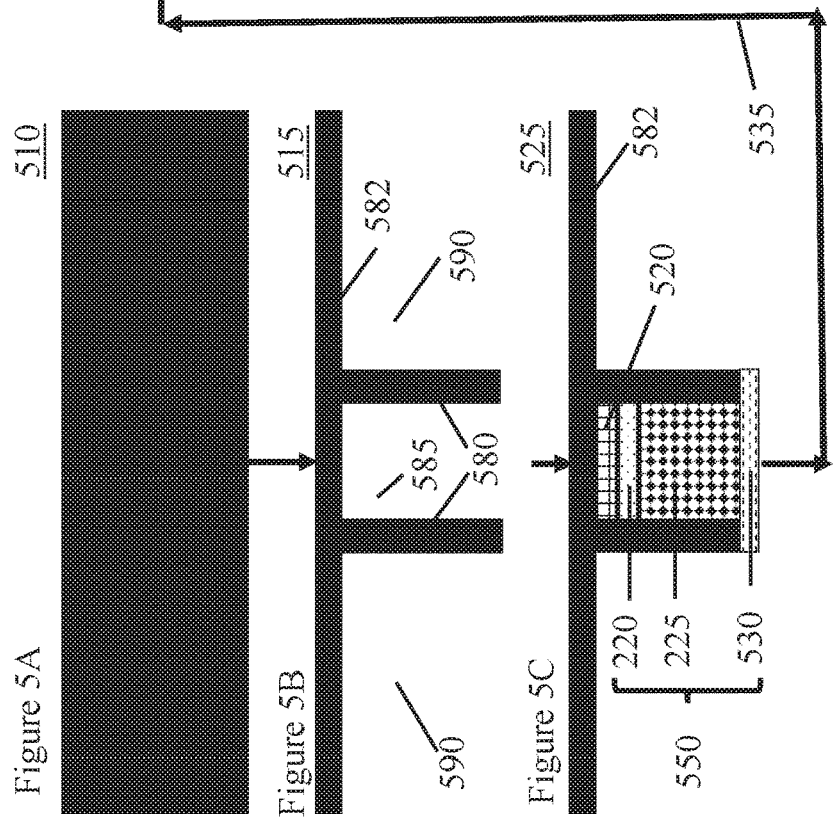
Figure 5A
Figure 5B
Figure 5C

ENCAPSULATING IN-SITU ENERGY STORAGE DEVICE WITH ELECTRODE CONTACT

BACKGROUND

The present invention relates to encapsulating in-situ and ex-situ energy storage devices. More specifically, the invention relates to encapsulating in-situ and ex-situ lithium batteries with various cathode contacts.

In-situ energy storage devices are energy storage devices in which high functioning active layers are enabled by inducing electrochemical charge mobility in the device. Ex-situ energy storage devices are energy storage devices which are fully electrochemically enabled upon fabrication of the full cell.

The integration of energy storage devices, e.g. batteries, in microprocessor and memory chips is a significant requirement for the IoT (Internet of Things) devices and other applications. These other applications include mobile devices; sensory equipment; and autonomous environmental, biological, and social functioning machines. Common examples of such functional devices are smart dust and/or biomedical sensory/medicine-delivery devices.

Most or all solid-state energy storage devices will need to integrate lithium metal electrode material into the overall device cell structure due to lithium metal's extremely high theoretical specific capacity (3860 mAh/g.)

Over the next generation, as human controlled and autonomous devices increasingly become miniaturized, total energy consumption requirements for some of these electronic devices will decrease. Miniaturized energy storage devices are expected to provide less than 1 Watt for these devices. However, because the energy storage cells are miniaturized to embed in CMOS circuitry, the cell energy and power density will be high.

There is a need for encapsulation of miniaturized energy storage devices to prevent device internals from leaking to external circuitry and the environment and to prevent external contaminants from entering the device. In addition, the device encapsulation must allow for electrical connection to outside circuitry.

Three-dimensional encapsulation and sealing materials need to fit together with other 3-dimensional (3D) device components in a complimentary fashion to enable higher full energy storage device performance of integrated, 3D energy storage devices providing high energy and power density. For example, 3D cathode active material needs to connect to a sealing current collector attached to or integrated into a 3D anode material with its own integrated current collector within a hermetically sealed architecture. Failure to achieve proper integration and connection is observed to reduce the device's energy capacity, energy density, and/or rate or power capabilities, when compared with 2D analogs of the respective device. It is desirable that standard manufacturing techniques enable the device encapsulation.

SUMMARY

Embodiments of an energy storage device are disclosed along with methods of making the device. The device comprises a substrate with one or more trenches. One or more electrically insulating layers line the trench sides and cover the top of the substrate. The following precursor materials are disposed within the trench: an anode, an electrolyte disposed on the anode, and a cathode structure disposed on the electrolyte. Variations of an electrically conductive contact are disposed on and in electrical contact with the cathode structure. At least part of the conductive contact is disposed within the trench and the conductive contact partially seals the anode, electrolyte, and cathode structure within the trench. Conductive adhesives are used to complete the seal. Methods to mass produce the devices are disclosed.

BRIEF DESCRIPTION OF THE DRAWINGS

FIG. 5A is a diagram of a precursor material and shape for a pi-shaped cathode contact.

FIG. 5B is a diagram of a pi-shaped cathode contact.

FIG. 5C is a diagram of a pi-shaped cathode contact, assembled and filled with a cathode structure and adhered separator, being deposited into an energy storage structure, e.g. a battery.

FIG. 5D is a cross section elevation of an energy storage structure with an inserted pi-shaped cathode contact integrated with a cathode assembly.

DETAILED DESCRIPTION

Figure 1:
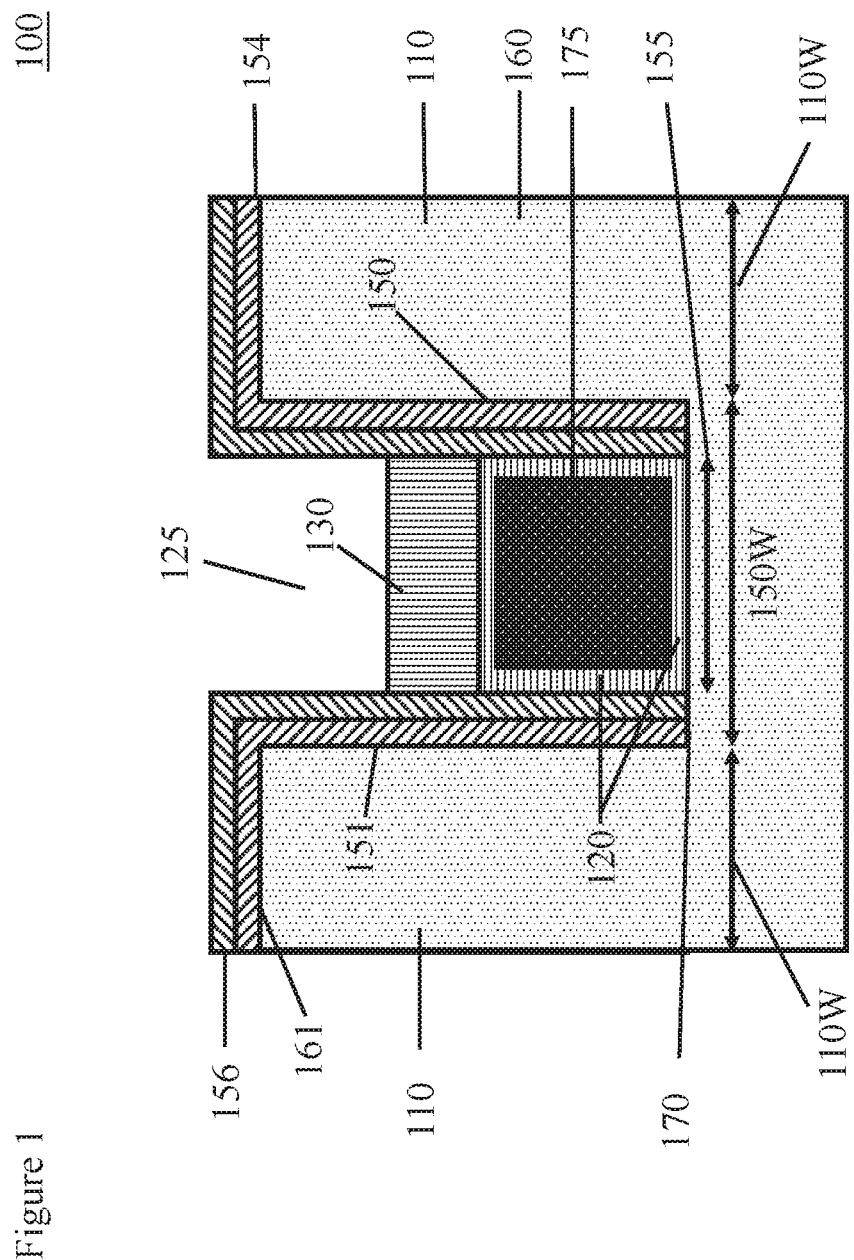
FIG. 1 is a cross section elevation of a preliminary energy storage device in-situ structure where the top contact is not yet integrated.

It is to be understood that the various layers and/or regions shown in the accompanying drawings are not drawn to scale. Omission of one or more commonly used layers, materials, or regions does not imply that the layers and/or regions not explicitly shown are omitted from the actual devices.

In addition, certain elements may be left out of a view for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located. Terms such as "thick", "thickness", "thin", or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element.

As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

With reference now to Figures, FIG. 1 is a cross section elevation of a preliminary energy storage device in-situ structure 100.

The structure begins with a substrate 160 made of Silicon (Si). Other semi-conductor materials can be used. One or more trenches 150 are etched out of the substrate 160 using known techniques. The trench 150 has a trench width 150W and one or more trench sides 151. The substrate 160 has a substrate top 161.

In some embodiments, the trench width 150W is between 0.96 and 1.03 millimeters (mm) wide. In some embodiments, the trench has a depth (into the Figure, not shown) equal to the trench width 150W producing a trench bottom 170, nominally 1 mm$^2$. In other embodiments, the trench depth is less than the trench width. In other embodiments, the trench depth is greater than the trench width. Other dimensions of the trench 150 are envisioned, particularly for energy storage devices that are scaled to larger sizes where aspect ratios of the trench depth to width can span from less than 1:1 to greater than 10:1. Other shapes of the trench bottom 170 are also envisioned.

The substrate regions bordering the sides of the trench are sidewalls 110 of the trench 150. The sidewalls 110 have a sidewall width thickness 110W of about 0.15 mm to 2 mm. In some embodiments, the sidewall thickness 110W is determined by the dimensions of the structure 100 if diced/singulated from the substrate 160 (wafer) or by the pitch dimension of other energy storage structures 100 adjacent on a larger substrate 160. Other sidewall thicknesses 110 are possible, depending on the design.

A first 154 and optionally a second 156 insulating layer are conformally deposited on the structure 100 to cover the sides of the trench, the trench bottom 170, and the top surface of the substrate 160. The insulating layers (154, 156) are made of an electrically insulating, dielectric material. In some embodiments, the insulating layers (154, 156) are made of Silicon Dioxide ($SiO_2$) or Silicon Nitride (SiN). The insulating layers (154, 156) are between 200 nanometers (nm) and 500 nm thick.

A directional etch, e.g. a reactive ion etch (RIE) is performed to remove the insulating layers (154, 156) from the trench bottom 170 between the insulating layers (154, 156) deposited on the side walls of the trench 150. Removing the insulating layers (154, 156) from the trench bottom 170 exposes the surface of the substrate 160 within an active region 125 at the bottom of the trench 150. The exposed surface of the substrate 160 later forms an active surface 260 (shown below) between the substrate 160 and the internal components of the energy storage structure 100, e.g. an anode 175, deposited in an active region 125.

The active region 125 is bounded by and is within the trench 150 between the insulating layers (154, 156). The active surface 260 has an active surface width 155 which in some embodiments is on the order of 1 mm. In some embodiments, the active surface width 155 is also the width of the active region 125. Other dimensions of the active surface width 155 are envisioned, particularly for energy storage devices, e.g. batteries that are scaled up in size.

Precursor materials are put within the active region 125 as the energy storage device, e.g. battery, is formed.

In some embodiments, a conductive adhesive layer 120 is optionally deposited in the bottom of the active region 125 of the trench 150 before the anode 175 material is deposited. In some embodiments, the adhesive layer is a polymer that chemically and physically adheres to the substrate 160 and anode 175. In some embodiments the conductive adhesive layer 120 is Polyaniline (PANI) or PANI with a conductive polymer/plasticizer, e.g. Succinonitrile (SN) or PANI with a conductive Lithium salt such as LiTFSI or PANI with LiTFSI and a composite polymer/graphite material or a composite of PANI with a conductive polymer/plasticizer, e.g. Polycapralactone (PCl)/Succinonitrile (SN), a conductive Lithium salt such as LiTFSI and carbon based (e.g., graphite, graphene, carbon nanotube, etc.) material.

Figure 2:
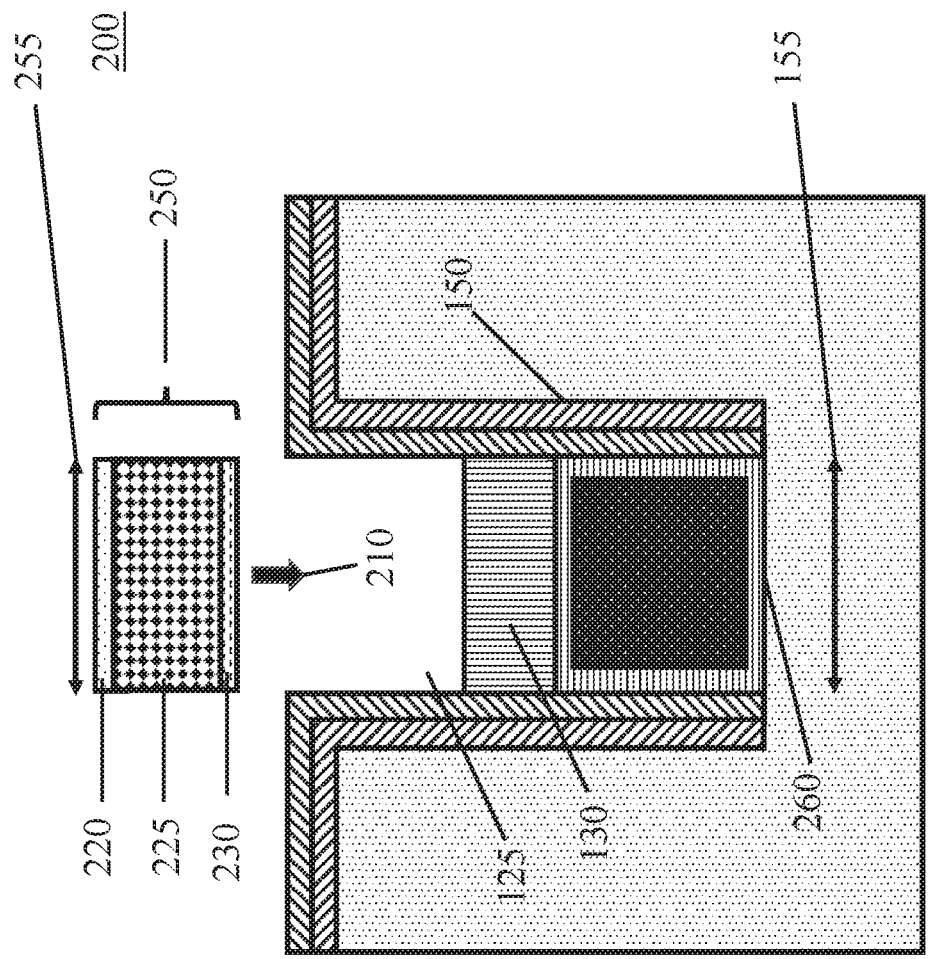
FIG. 2 is a cross section of an elevation of a preliminary energy storage structure with one embodiment of a cathode structure with a top contact layer being placed in an active region.

The conductive adhesive layer 120 may initially be deposited on the substrate 150 active surface 260 (see FIG. 2). However, during pre-operation and operation of the device, material in the conductive adhesive layer 120 can migrate around, throughout, and over the anode 175.

The deposited anode 175 can be made of any material used for anode purposes, e.g. graphite.

There is an electrolyte layer 130 deposited above the anode. In some embodiments, this layer can be made of any electrolytic material, e.g. a liquid or solid electrolyte. In other embodiments, a solid polymer electrolyte (SPE) is used. An example material for the SPE is a composition using a separator material (e.g. a fabric-like inter-woven layer material like polyacrylnitrile, PAN) saturated in polymers like polycaprolactone (PCl) and succinonitrile (SN) and mixed with a lithium salt compound such as Lithium bis(trifluoromethanesulfonyl)imide (LiTFSI).

It is noted that in some embodiments, while these materials are deposited in the active region 125 in a particular form, after the initial battery structure is completed and the battery is encapsulated, preliminary and regular operation of the device cause physical, chemical, and electrochemical transformations of these regions and materials which change the characteristics of the device. For example, during galvanic cycling, in some embodiments, the active surface 260 of the device is transformed so that the active surface 260 is no longer an isolated layer on top of the substrate 160, but rather an integrated composite layer sandwiched between the substrate 160 and the anode material 175—electrochemically and physically binding the two layers above and below the active layer 260. Other transformations also occur.

Galvanostatic cycling is a process where current is forced through the battery (galvanostatic cell cycling) between an electrode with lower voltage and an electrode with higher cell voltage by applying a current which drives the mobile charge host (e.g., Li-ions) to transfer between the two electrodes. During this cycling operation, the lithium ions and precursor materials migrate through the structures of the device to physically, chemically, and electrically transform the precursor materials within the active region 125, as electrons are driven through an external circuit of the cell in parallel with the ion migration.

Since these changes occur within the trench 150, the energy storage device/battery is formed in-situ within the trench 150.

FIG. 2 is a cross section of an elevation of a preliminary energy storage structure 200 with one embodiment of a cathode structure 250 being placed 210 into the active region 125. The active surface 260 is shown.

The cathode structure has a width 255 (and depth, into the Figure, not shown) the same as (or slightly smaller than) the active surface width 155 (depth) so the cathode structure 250 fits within the active region 125 and forms a partial seal to keep the electrolyte 130 and anode 175 encapsulated in the active region 125.

Figure 3:
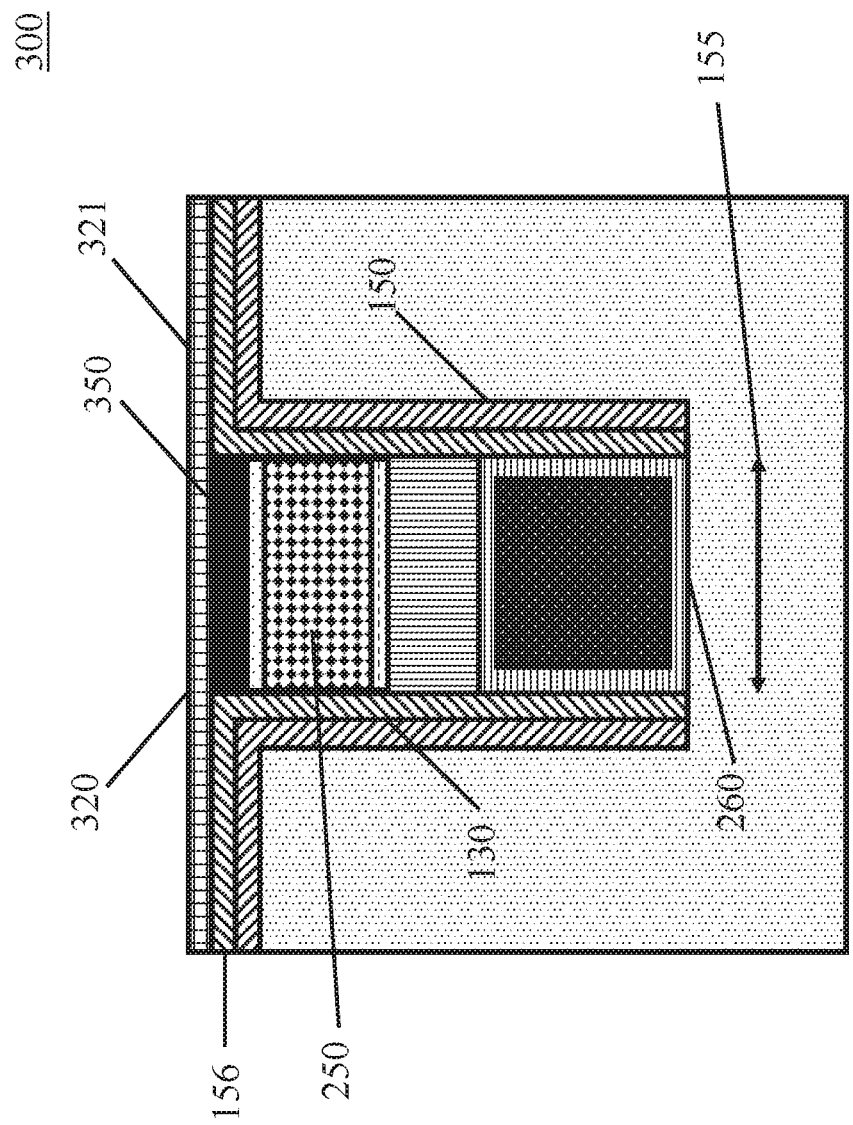
FIG. 3 is a cross section of an elevation of an energy storage/battery structure with one embodiment of the cathode structure in place in the active region, completed with deposition of a cathode contact within a trench, and sealed with a conductive adhesive.

In preferred embodiments, the cathode structure or cathode stack 250 comprises a dielectric separator 230, a cathode/electrode 225, and a conductive layer 220, where the dielectric separator is adhered to the bottom surface of the cathode/electrode, e.g. 350 as shown in FIG. 3.

In some embodiments, the dielectric separator 230 electrically isolates the cathode 225 from the electrolyte. In some embodiments, the dielectric separator 230 prevents the flow of electrons but permits ionic current, e.g. the flow of lithium ions.

In some embodiments, the dielectric separator 230 is a woven fabric-like polymer material which is not conductive to electrons like Polyacrylnitrile (PAN) that is between 25 microns and 100 microns thick. Other known separators can be used such as quarternized polysulfone membranes, electrospun Polyvinylidene fluoride, methylmethacrylate (MMA)/polyethylene (PE) composites, etc.

The conductive layer 220 can be made of any conductive material, like a metal. In some embodiments, the conductive layer 220 is a metallic foil made of any metal like Aluminum (Al), Al alloys, Copper (Cu), Titanium (Ti), Titanium Alloys, Nickel Alloys and Nickel (Ni). Thicknesses can range from approximately 15 microns to over 150 microns, with other thicknesses possible.

The cathode 225 can be made of any known cathodic material.

Thickness ranges of the cathode material are often material and dimensionality dependent, but in general, cathode thicknesses can range from 15 microns to over 200 microns, depending on the material used. For Lithium Manganese Oxyfluoride, with an approximate stoichiometry of $Li_2MnO_2F$, (LMOF) cathode materials, a preferred thickness range is 35 microns to 100 microns.

After the cathode structure 250 is made, the cathode structure 250 is deposited/placed in the active region 125. The placement can be performed by known pick and place processes. In some embodiments, the cathode stack 250 is fabricated in a relatively large area, and then diced or cut to desired dimensions, then placed in the active region 125. In some novel processes (see below), multiple cathode structures 250 are each placed in an active region 125 of one of multiple trenches 150 on a substrate 160.

In some embodiments, the cathode 225 is made of LMOF in combination with a solid polymer electrolyte (SPE) material, conductive additives, and binders.

LMOF in combination with an SPE is a novel composition of matter that when used as a cathode 225 has a low material impedance, low interfacial impedance, a low in circuit impedance, good electrical characteristics, and good adhesion to device components. The composition using LMOF has a higher concentration of lithium (two lithium atoms per molecule) compared with conventional cathode type materials (e.g., lithium iron phosphate, etc.) and therefore enables a higher current capacity and a higher device voltage at a given current.

In some embodiments, the LMOF active material comprises between 55 percent and 85 percent by mass of the total cathode 225 while the SPE material makes up between 7.5 percent and 20 percent by mass of the total cathode 225. When added, a conductive additive, like carbon black or carbon nanotubes, comprises between 5 percent and 15 percent by mass of the cathode 225. Binders can comprise 4 to 10 percent by mass of the cathode 225.

FIG. 3 is a cross section elevation view of an energy storage/battery structure 300 with one embodiment of the cathode structure 250 in place in the active region 125, followed by placement of a cathode contact 350, and hermetically sealed with a conductive adhesive 320.

In some embodiments, the conductive adhesive only adheres the electrode to the conductive contact 350 and a non-conductive adhesive hermetically seals the top contact to the substrate/field. In this embodiment, the conductive adhesive provides an electrical contact to the conductive contact 350 and the non-conductive adhesive provides hermetic sealing or additional hermetic sealing and reduces the risk cell shorting.

The cathode contact 350 can be made of any conductive material including metals like Al, hardened AL alloys, Titanium (Ti), Titanium Alloys, and Nickel (Ni). The cathode active material 225 can be directly deposited on the cathode contact with or without the use of a conductive adhesive material or binder. In preferred embodiments, the cathode contact 350 is coated with conductive carbon paint, polyaniline (PANT), or Li-Salt containing PANI (LiTFSI- PANI) and dried and/or annealed prior to cathode active material 225 deposition. The cathode contact 350 is in electrical and physical contact with the cathode structure 250 and in some embodiments is entirely within the trench 150 with a top that is coplanar with the top of structure 200, e.g. the top of the second insulating layer 156.

In preferred embodiments a conductive adhesive 320 is disposed on top of the structure 300 using standard techniques. The conductive adhesive 320 completes the hermetic seal of the trench 150 and permits electrical connection from external circuitry to the cathode contact 350 and therefore to the internals of the storage/battery structure 300. In some embodiments, the surface of the conductive adhesive 320 is planarized, e.g. by a chemical-mechanical polishing (CMP) or doctor blading techniques. In alternative embodiments, the conductive adhesive 320 self-levels to create a planar top surface of the device 300.

In some embodiments the conductive adhesive is made of materials such as silver epoxy and has a thickness between 15 microns and 150 microns, but other thicknesses are possible.

Figure 4:
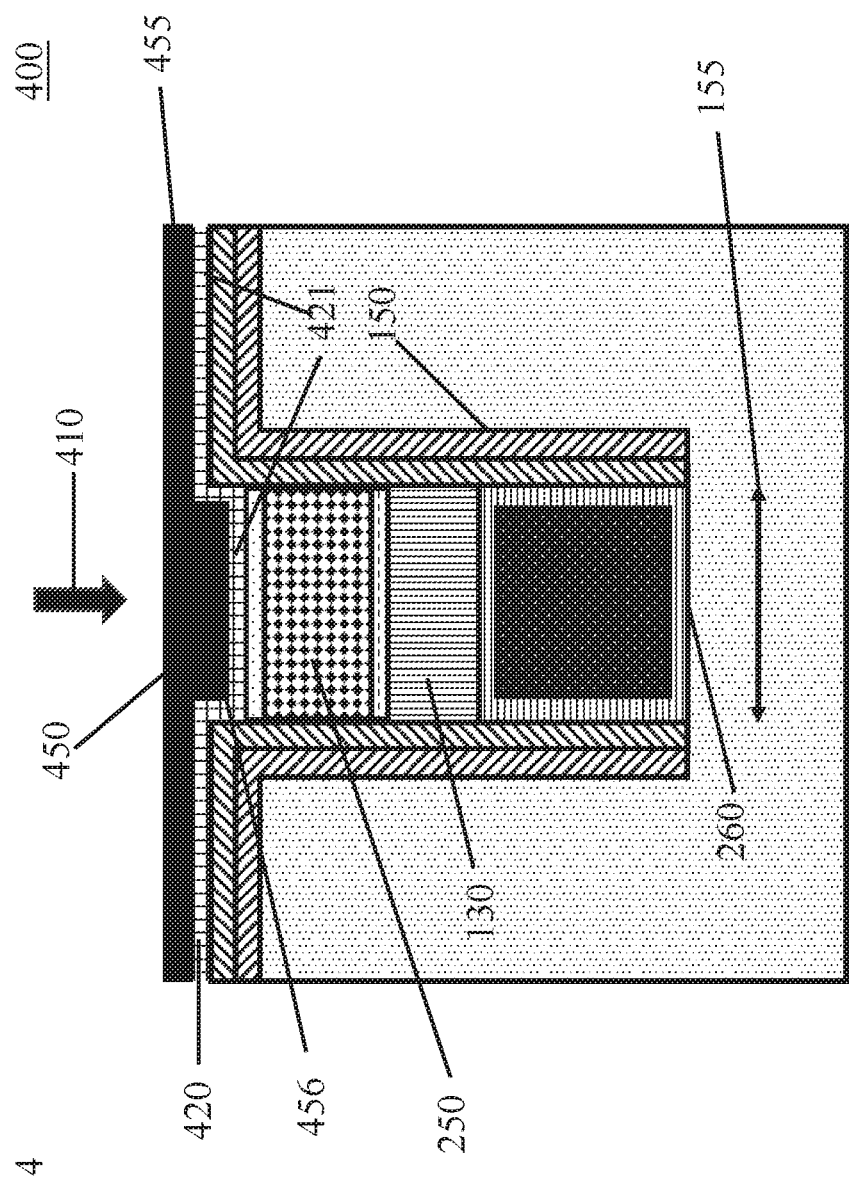
FIG. 4 is a cross section of an elevation of a preliminary energy storage structure in FIG. 3 with an alternative embodiment of a 3-Dimensional, "T-shaped" cathode contact being placed over the cathode structure.

FIG. 4 is a cross section of an elevation of a preliminary energy storage structure 400 with an alternative embodiment of a T-shaped cathode contact 450 being placed 410 over the cathode structure 250.

In this embodiment the T-shaped cathode contact 450 is conformally shaped to match the profile of the surface of the structure 400 including the open part on the top of the active region 125. In some embodiments the T-shaped cathode contact 450 has a top 455 and a slightly smaller protrusion (leg) that fits into the top of the active region 125. Conductive adhesive 420 fills the space 421 between the T-shaped cathode contact 450 top 455 and the top surface of the insulating layer 156 and between the T-shaped cathode contact 450 leg 456 and the top of the active region 125 created when placing 410 the T-shaped cathode contact 450 into the structure 400.

The conductive adhesive layer 420 permits electrical contact to the cathode structure 250 through the T-shaped cathode contact 450 to external circuitry while maintaining hermetically sealed encapsulation of the device internals within the trench 150.

FIG. 5A is a diagram of a precursor structure 510 for a pi shaped cathode contact 515. In some embodiments, the conductive structure 510 is made of Al, Al alloys, Ni, Ti, or other metals and alloys thereof. The precursor structure 510 is processed, e.g. etched, electroplated or laser ablated by known techniques, to create a pi-shaped cathode contact 515 shown in FIG. 5B.

FIG. 5B is a diagram of the pi-shaped cathode contact 515. The pi-shaped cathode contact 515 has two legs 580 with a cathode space 585 between the two legs 580. The pi-shaped cathode contact 515 has a pi-top 582. There is an open region 590 on either side of the two legs 580 outside of the cathode space 585. The open region 590 enables the pi-shaped cathode contact 515 to insert 535 the cathode structure 550 assembled within the cathode space 585 into the active region 125 without interference from the pi-top 582.

FIG. 5C is a diagram of a pi-shaped cathode contact 515 assembled with a cathode structure or cathode stack 550 where the assembly (515, 550) is placed 535 into an energy storage structure, e.g. a battery 500. The placement 535 is done by known pick and place technologies. Alternatively, the placement 535 of multiple assemblies (515, 550) is done simultaneously by alignment techniques disclosed.

In some embodiments, the cathode structure 550 comprises a dielectric separator 530, a cathode/electrode 225, and a conductive layer 220.

In some embodiments, a conductive adhesive layer 520 is first deposited into the cathode space 585. The conductive adhesive layer 520 provides good electrical contact and adhesion between the cathode structure 550 and the pi-top 582 within the cathode space 585. In some embodiments the conductive adhesive layer 520 is Polyaniline (PANI) or PANI with a conductive polymer/plasticizer, e.g. Succinonitrile (SN) or PANI with a conductive Lithium salt such as LiTFSI or PANI with LiTFSI and a composite polymer/graphite material or a conductive carbon based coating or paint.

The conductive layer 220 is placed within the cathode space 585 followed by the cathode material 225. These materials can be the same as those used with the cathode structure 225. They are deposited by known techniques including but not limited to pouring, casting, pipette, thin coat, spin coating, lamination on a heated sheet (e.g. with a doctor blade) and dropping (drop casting) into the cathode space 585. The cathode material can be isostatically pressed or hot pressed to increase the adhesion and density of the active cathode material—often enabling better cycling performance as observed with a decrease in impedance when cycling the cell.

The dielectric separator 530 is made of the same materials as in the cathode structure 225. However, the width of the dielectric separator 530 extends to cover the bottoms of the legs 580 so that the cathode contact 515 is not in electrical contact with the electrolyte 130.

FIG. 5D is a cross section elevation of an energy storage structure with an inserted pi-shaped cathode contact 515 integrated with a cathode assembly 550. In some embodiments, a layer of conductive adhesive 520 is applied to the bottom surface of cathode contact 515 and/or the top of the insulating layer 156. The conductive adhesive provides electrical contact and adhesion between the cathode contact 515 and the active region 125 and adhesion to the insulating layer 156. In addition, the conductive adhesive 520 hermetically seals the active region 125 while the cathode contact 515 has electrical connection to the cathode 225 and other internal structures. In some embodiments, the same conductive layer materials described above are used.

Figure 6:
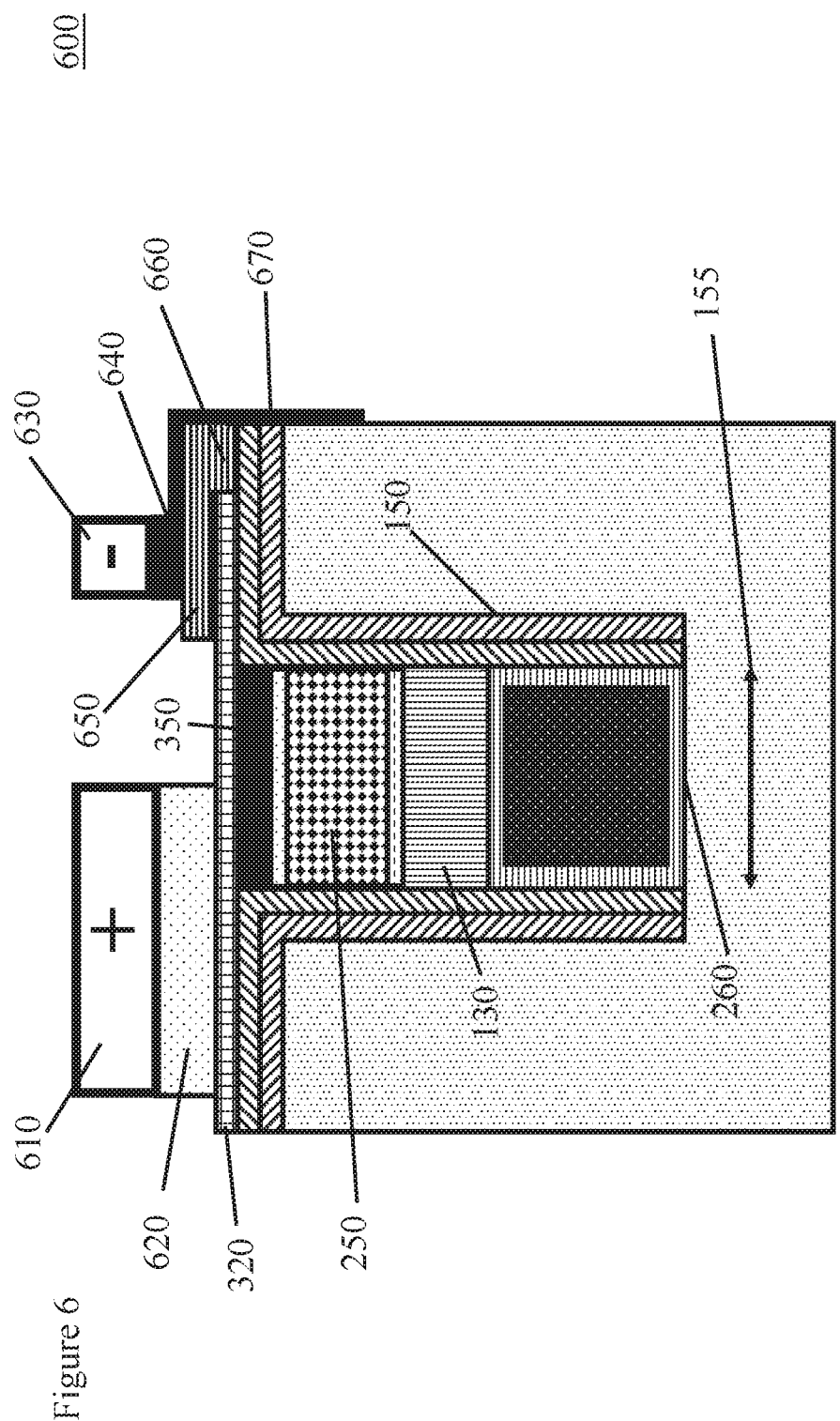
FIG. 6 is a cross section elevation of a completed, hermetically sealed energy storage structure with external contacts including a cathode contact.

FIG. 6 is a cross section elevation of a completed, hermetically sealed energy storage structure 600 with a cathode contact 350 and external contacts (610, 630).

A conductive adhesive 620 electrically connects the positive electrical terminal 610 to the conductive adhesive 320 by using known techniques and materials.

For the connection of the negative electrical terminal 630, a terminal insulating layer 650 first is be deposited. The terminal insulating layer 650 is made of a non-conductive material like an oxide, nitride, Silicon Dioxide (SiO2), or Silicon Nitride (SiN). In some embodiments, the conductive adhesive layer 320 is etched back (or not deposited) near the substrate connection 670. In some embodiments, the non-conductive material also is deposited 660 where the conductive adhesive layer 320 is removed/missing so that the substrate connection 670 does not electrically short to the positive electrical terminal 610 through the conductive adhesive layer 320.

The negative electrical terminal 630 is disposed on the terminal insulating layer 650 and connected 640 to the substrate connection 670 using known materials and techniques. In some embodiments, the substrate connection 670 and connection 640 is a wire bond connection through the substrate 160 to the anode 175.

In some embodiments, the positive 610 and negative 630 terminals are between 20 microns and 200 microns thick.

Figure 7:
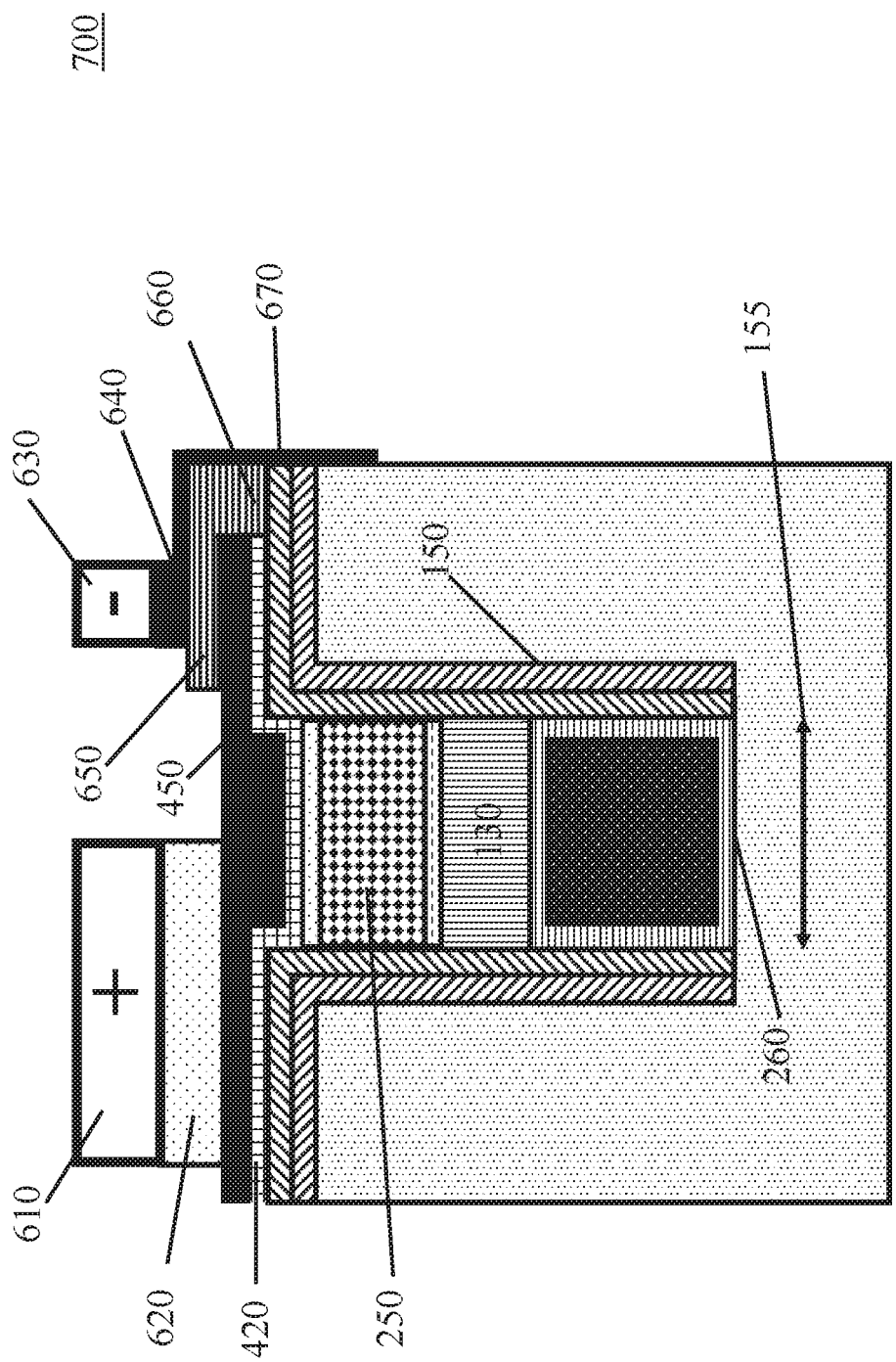
FIG. 7 is a cross section elevation of a completed, hermetically sealed energy storage structure with external contacts including a T-shaped cathode contact.

FIG. 7 is a cross section elevation of a completed, hermetically sealed energy storage structure 700 with a T-shaped cathode contact 450 and external contacts.

The positive electrical terminal 610 and negative electrical terminal 630 are attached in this structure 700 as described in the description of FIG. 6. In this embodiment, the part of the T-shaped cathode contact 450 near the substrate connection 670 is replaced with non-conductive material 660 as well.

Figure 8:
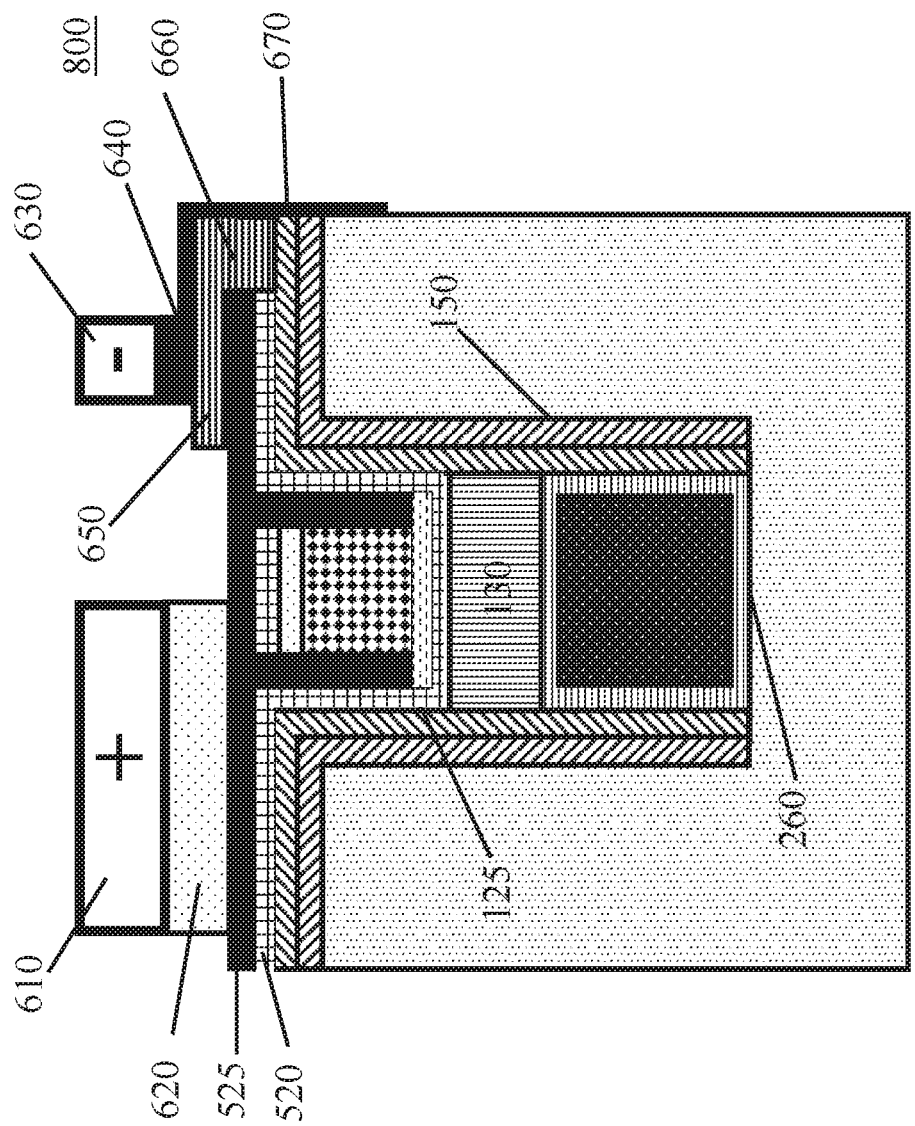
FIG. 8 is a cross section elevation of a completed, hermetically sealed energy storage structure with external contacts including a pi-shaped cathode contact.

FIG. 8 is a cross section elevation of a completed, hermetically sealed energy storage structure 800 with a pi-shaped cathode contact 515, cathode structure 550, and external contacts (610, 630).

The positive electrical terminal 610 and negative electrical terminal 630 are attached in this structure 700 as described in the description of FIG. 6. In this embodiment, the part of the pi-shaped cathode contact 515 near the substrate connection 670 is replaced with non-conductive material 660 as well.

In some embodiments, the cathode structure 550 has a conductive layer disposed between the two legs 580 of the pi-shaped conductive contact 590, electrically connecting the cathode 225 and conductive contact 590. In some embodiments, there is an additional non-conductive adhesive layer (not shown) covering the outside of the two legs 580 of the pi-shaped conductive contact where the non-conductive adhesive layer completely seals the pi-shaped conductive contact to the sidewalls of the trench and where the non-conductive adhesive resides between the top contact and the top surface/field of the trench substrate completely sealing the anode, electrolyte, and cathode structure within the trench.

Figure 9A:
FIG. 9A is a dimensional drawing of a cathode contact.

FIG. 9A is a dimensional drawing of a cathode contact 905.

Figure 9B:
FIG. 9B is a dimensional drawing of a T-shaped cathode contact.

FIG. 9B is a dimensional drawing of a T-shaped cathode contact 910.

Figure 9C:
FIG. 9C is a dimensional drawing of a pi-shaped cathode contact.

FIG. 9C is a dimensional drawing of a pi-shaped cathode contact 915.

The dimensional drawings of each design in FIGS. 9A, 9B, and 9C illustrate the relative shape, function and dimensionality of the 3 top contacts presented in the current invention. Each top contact design has specific function and use for hermetic sealing and attachment of active electrode materials.

For example, FIG. 9A illustrates a 2D type top contact which can fit into a trench with the electrode material attached and/or the separator material attached to the surface of the electrode material. FIG. 9A could also be utilized for contacting an active electrode material which is already deposited in the 3D energy storage device trench.

Additionally, the "T" shaped top contact in FIG. 9B can be used for the same function as FIG. 9A yet the "T" shaped contact can enable better hermetic seal onto the surface/field of the substrate. Also, the "T" shaped contact can better pressurize the active components of the cell upon being inserted into the trench and hermetically sealed to the field.

FIG. 9C can be utilized for the same purpose of FIG. 9B, however FIG. 9C yields the additional option of depositing a slurry electrode material into the cathode space 585 of the top contact 515 prior to integration into the full energy storage device.

Figure 10:
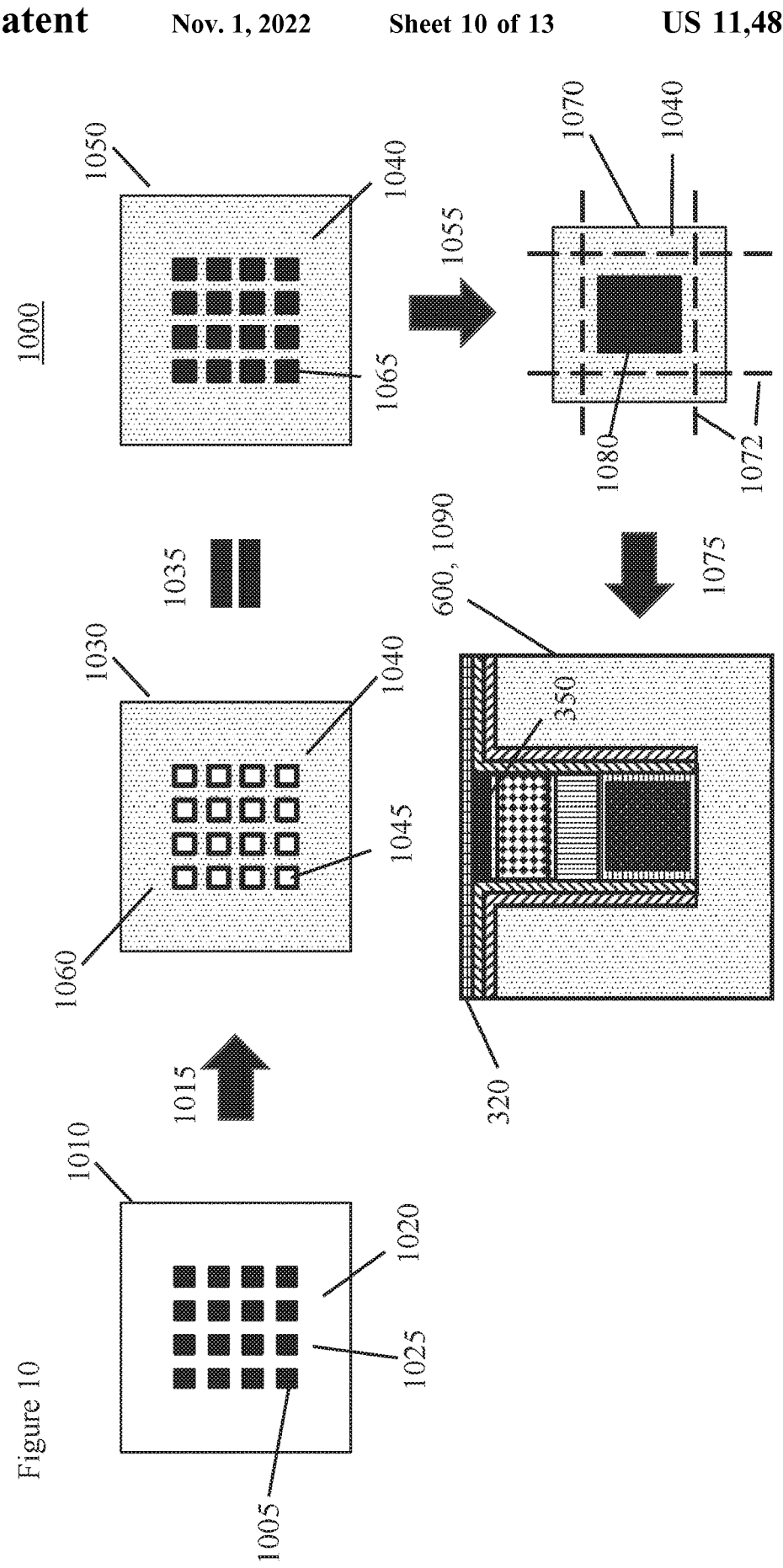
FIG. 10 is a process flow for an integration scheme using one cathode contact embodiment to encapsulate a plurality of in-situ batteries.

FIG. 10 is a process flow 1000 for an integration scheme for the top contacts shown in FIG. 9A, where, the top contacts (containing active electrode material and/or separator material) are inserted into the complimentary energy storage device housing substrate, already containing the remaining active energy storage device components. In other embodiments, all active materials (e.g., cathode, separator, electrolyte, anode and interfacial additives) are already present in the trench space prior to deposition of the top contact (which may or may not contain a conductive adhesive).

In step 1010, there is a contact substrate 1020 with an array 1025 of a plurality of conductive (cathode) contacts (905, 1005) deposited on the contact substrate 1020 or an array 1025 of a plurality of conductive contacts (905, 1005) etched into a conductive contact substrate 1020.

In step 1030 there is an array 1040 of trenches (150, 1045) within a device substrate (1060, 160) with precursor materials deposited in the trenches (150, 1045) as described above.

Each of the trenches (150, 1045) is in a position on the device substrate (1060, 160) that corresponds to and is aligned with a conductive contact (905, 1005) on the contact substrate 1020 so that when the contact substrate 1020 is placed 1015 on the device substrate (1060, 160) each of the conductive (cathode) contacts (905, 1005) is inserted 1035 into the corresponding trench (150, 1045).

In step 1050, once the contact substrate 1020 and device substrate (1060, 160) are integrated 1035, each trench 1045 can be pressurized and hermetically sealed by the respective top contact 1005. Optionally, the contact substrate 1020 can be grinded or polished to planarize the top contact with the substrate surface, e.g. by chemical-mechanical polishing (CMP), and then a conductive sealant such as silver epoxy is applied across the entire surface/substrate field. In some embodiments, the conductive sealant 320 is then planarized. The structure 1080 is hermetically sealed.

The final cured and sealed array 1040 moves 1055 to step 1070, where the die 1080 is diced or singulated from the bulk substrate 1040, where the desired area of the bulk substrate is eliminated using methods 1072 such as sawing, scribing, cleaving, laser ablation, diamond cutting, or combinations thereof. External contacts are attached 1075 resulting in the final battery (600, 1090).

Figure 11:
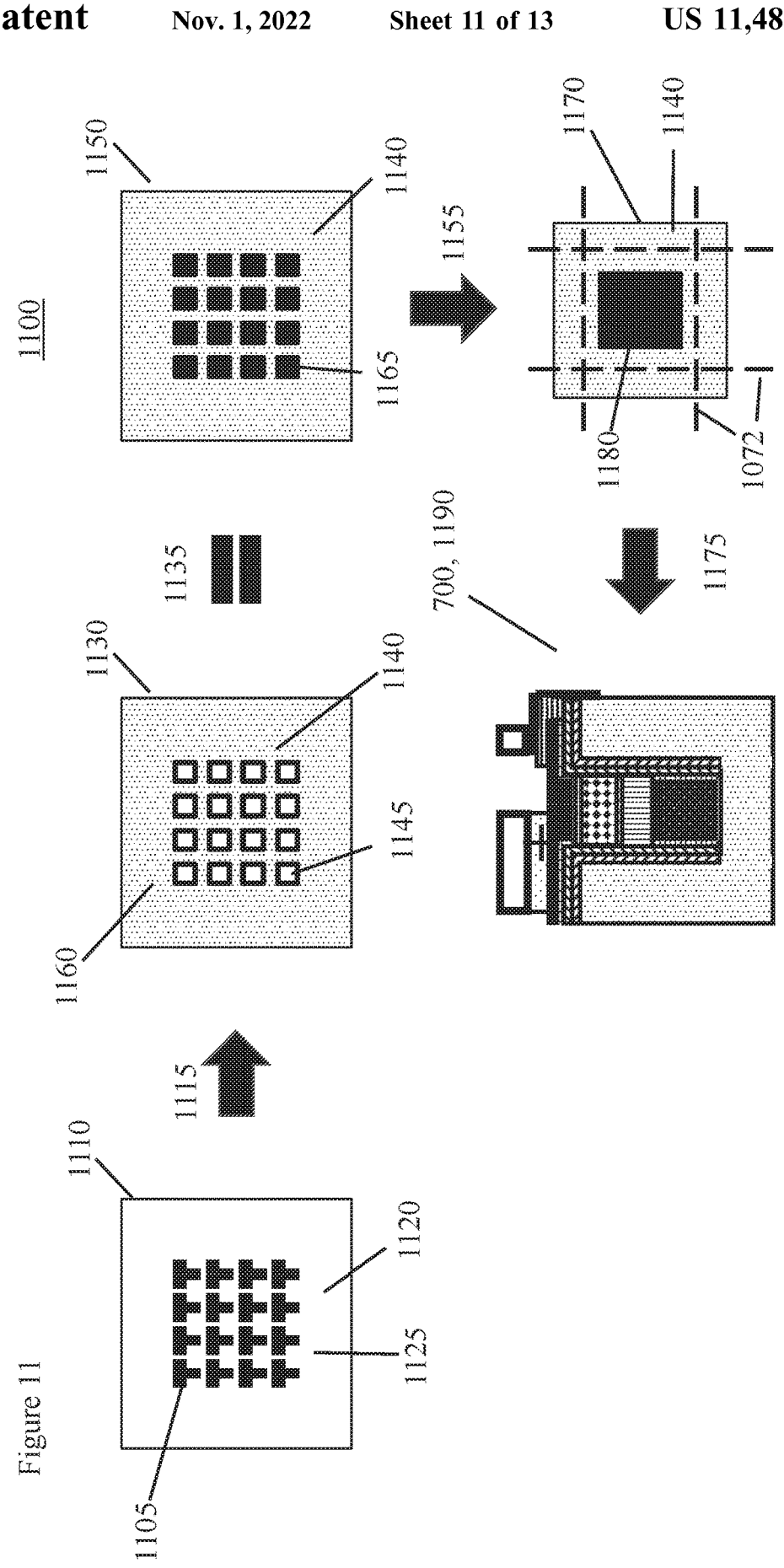
FIG. 11 is a process flow for an integration scheme using a T-shaped cathode contact embodiment to encapsulate a plurality of in-situ batteries.

FIG. 11 is a process flow 1100 of an integration scheme for the top T-shaped contacts 910 shown in FIG. 9B.

In step 1110, there is a contact substrate 1120 with an array 1125 of a plurality of T-shaped conductive (cathode) contacts (910, 1105) created via laser ablation, etching and/or electroplating, from the contact substrate 1120 in an array 1125 of a plurality of conductive contacts (910, 1105).

In step 1130 there is an array 1140 of trenches (150, 1145) within a device substrate (1160, 160) with precursor materials deposited in the trenches (150, 1145) as described above.

Each of the trenches (150, 1145) is in a position on the device substrate (1160, 160) that corresponds to and is aligned with a conductive contact (910, 1105) on the contact substrate 1120. In some embodiments, a conductive adhesive 420 is applied across the surface/substrate field of the device substrate (1160, 160). When the contact substrate 1120 is placed 1115 on the device substrate (1160, 160) each of the conductive (cathode) contacts (910, 1105) is inserted 1135 into the corresponding trench (150, 1145).

Proceeding 1135 to step 1150, where the contact substrate 1120 and device substrate (1160, 160) are integrated. Since each trench 1145 already contains the active energy storage device precursor components, and the field area (surface) of the device substrate (1160, 160) already has a layer of sealant/epoxy already deposited on it, once integrated, the top contact (910, 1105) can be pressurized and hermetically sealed through curing methods.

The final cured and sealed material 1140 then moves 1155 to step 1170, where the die 1180 is diced or singulated 1155 from the bulk substrate array 1140 using methods 1072 such as sawing, scribing, cleaving, laser ablation, diamond cutting, or combinations thereof. The external contacts are connected 1175 resulting in the battery structure (700, 1190).

Figure 12:
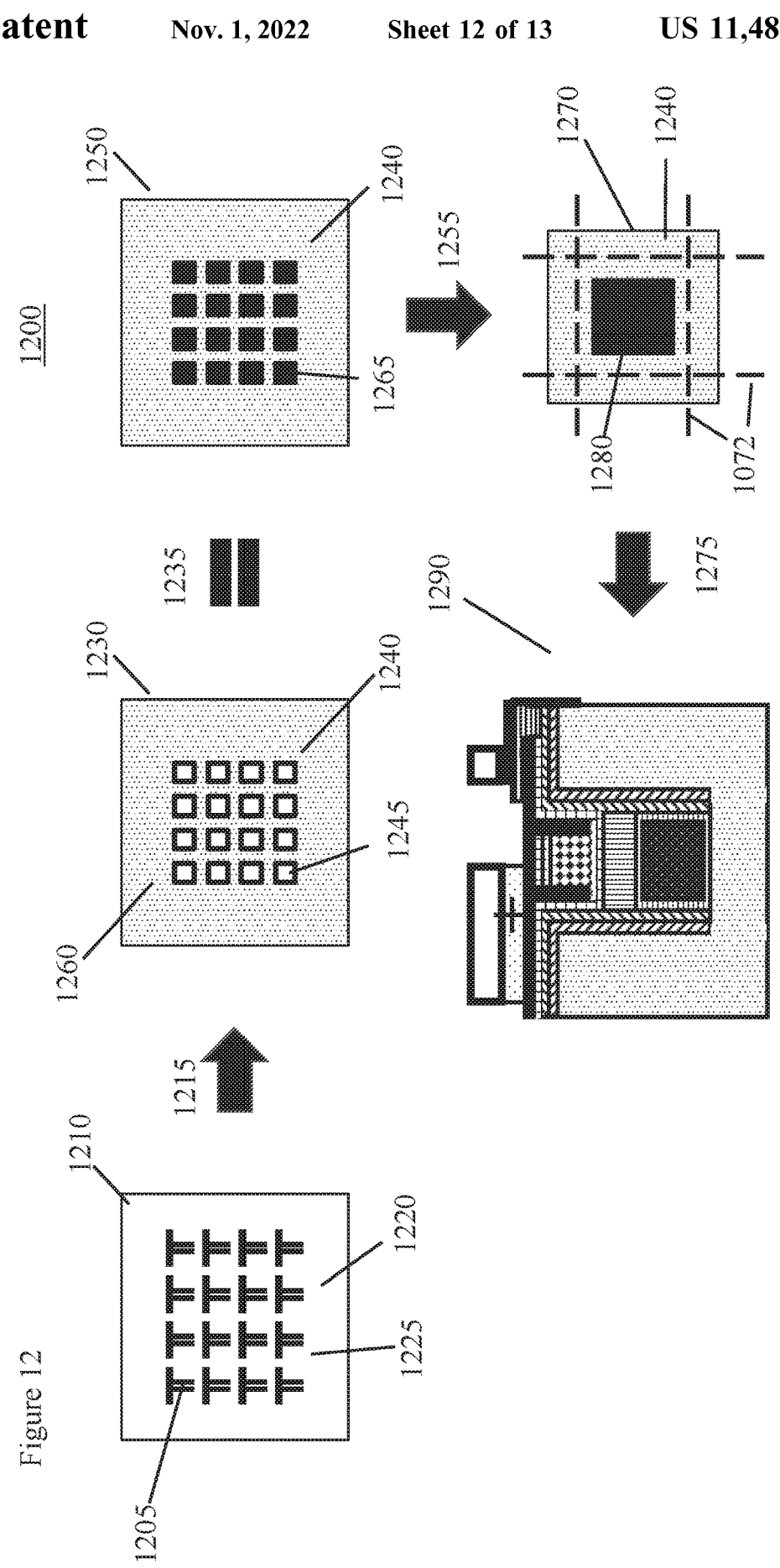
FIG. 12 is a process flow for an integration scheme using a pi-shaped cathode contact embodiment to encapsulate a plurality of in-situ batteries.

FIG. 12 is a process flow 1200 of an integration scheme for an array 1225 of the pi-shaped conductive (cathode) contacts 915 shown in FIG. 9C, where, the pi-shaped conductive contacts (915, 1105) may contain active electrode material 550 and/or separator material 530 in the cathode space 585 prior to integration 1235. In some embodiments of step 1210, the cathode structure 550 materials are placed into the cathode space 585 of the pi-shaped conductive contacts (915, 1205). Since the pi-shaped conductive contacts (915, 1205) are etched into or place on the substrate 1220 to form the array 1225, the deposition of the cathode structure 550 materials can be placed in the cathode space 585 of all the contacts 1205 in the same step 1210.

In step 1230 there is an array 1240 of trenches (150, 1245) within a device substrate (1260, 160) with precursor materials, other than the cathode structure materials, deposited in the trenches (150, 1245) as described above.

Each of the trenches (150, 1245) is in a position on the device substrate (1260, 160) that corresponds to and is aligned with a conductive contact (915, 1205) on the contact substrate 1220. In some embodiments, a conductive adhesive 520 is applied across the surface/substrate field of the device substrate (1260, 160). When the contact substrate 1220 is placed 1215 on the device substrate (1260, 160) each of the conductive (cathode) contacts (915, 1205) is inserted 1235 into the corresponding trench (150, 1245).

Moving 1235 to step 1250, the contact substrate 1220 and device substrate (1260, 160) are integrated. Since the surface or the field area of the device substrate (1260, 160) already had a layer of sealant/epoxy already deposited on it, once integrated 1250, the top pi-shaped contact (915, 1205) can be pressurized and hermetically sealed through curing methods.

The final cured and sealed material array 1240 moves 1255 to step 1270. The die 1280 is diced or singulated from the bulk substrate using methods 1072 such as sawing, scribing, cleaving, laser ablation, diamond cutting, or combinations. After the external contacts are connected 1275, the final structure (800, 1290) results.

Figure 13:
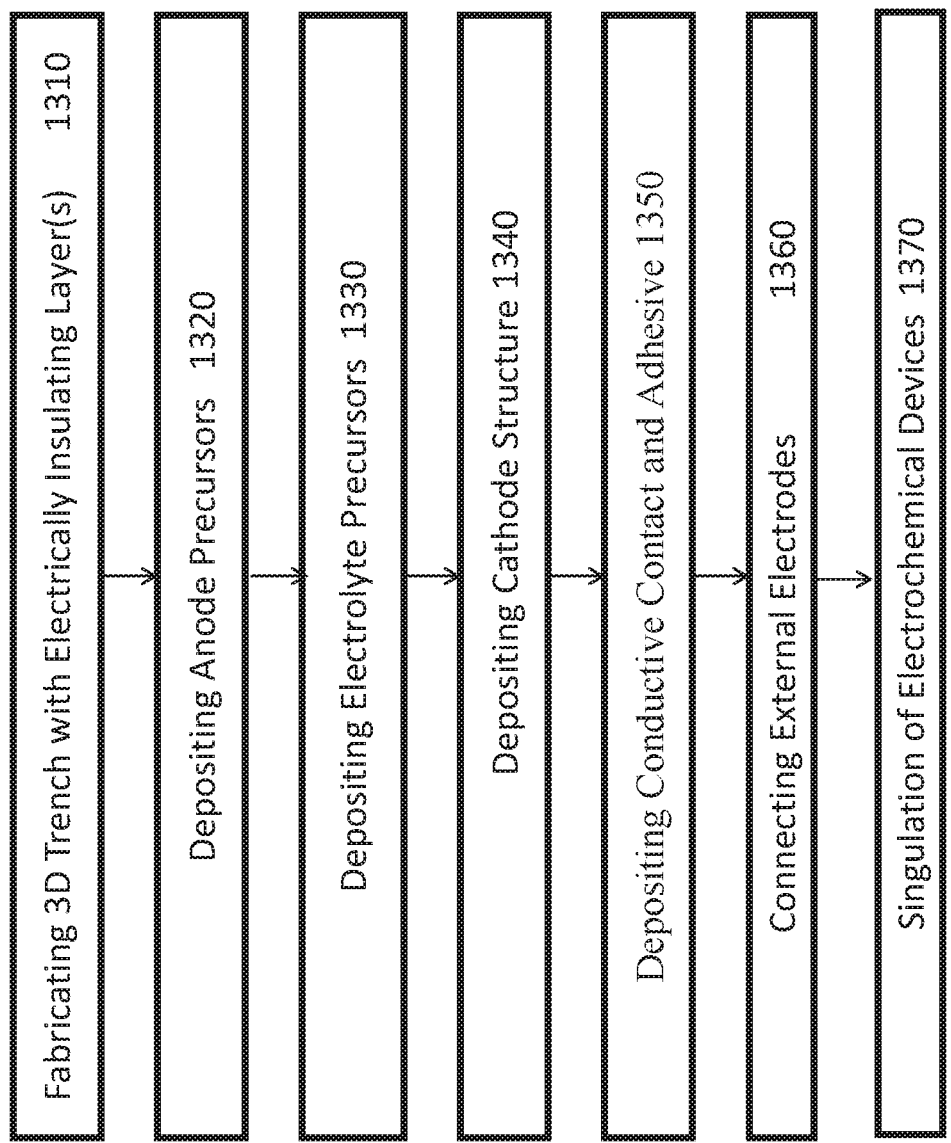
FIG. 13 is a flow chart showing the steps of a method for making an energy storage device.

FIG. 13 is a flow chart showing the steps of a process 1300 for making an energy storage device.

Step 1310 begins the process 1300 by fabricating one or more trenches in a Silicon (Si) substrate and conformally depositing at least one insulating layer on one or more walls of the trench and on a top of the Si substrate, as described above.

Depositing anode precursor materials within the trench occurs in step 1320.

Depositing electrolyte precursor materials on top of the anode precursor materials within the trench occurs in step 1330.

Depositing a cathode structure on the electrolyte precursor materials within the trench occurs in step 1340. Variations of depositing the cathode structure are described above.

Depositing a conductive contact on the cathode structure occurs in step 1350. Variations of conductive contacts, how they are inserted in the trench 150 and how they partially seal the anode precursor materials, electrolyte precursor materials, and the cathode structure within the trench are described above.

Connecting the external electrodes, as described above, occurs in step 1360.

Singulation of the electrochemical devices, as described above, occurs in step 1370. In some embodiments, a ratio of the cross section area of the active energy storage materials to the total area of the top contact is greater than or equal to 0.64

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An energy storage device comprising:
 a substrate with one or more trenches and a substrate top, each of the trenches having an active surface width and a trench bottom, the active surface width and the trench bottom defining an active region;
 one or more electrically insulating layers, the electrically insulating layers covering the substrate top and one or more sides of the trench, the trench bottom being an exposed surface of the substrate within the active region between the electrically insulating layers covering the one or more sides of the trench;
 an anode disposed within the trench in contact with the trench bottom at an active surface;
 an electrolyte disposed on the anode within the trench;
 a cathode structure disposed on the electrolyte within the trench, the cathode structure having a cathode structure width, the cathode structure width being the same as or slightly smaller than the active surface width so that the cathode structure fits within the active region to form a partial seal to keep the electrolyte and anode encapsulated in the active region;
 a cathode contact disposed on the cathode structure, the cathode contact having a top and at least one leg, at least part of each of the legs of the cathode contact being disposed within the trench and partially sealing the anode, electrolyte, and cathode structure within the trench; and
 a conductive adhesive layer disposed on top of cathode structure and on the one or more electrically insulating layers covering the substrate top, the conductive adhesive layer permitting electrical connection from external circuitry to the cathode structure,
 wherein the conductive adhesive layer is between the top and the one or more electrically insulating layers covering the substrate top, the conductive adhesive layer completely hermetically sealing the trench.

2. A device, as in claim 1, where the cathode contact is made of one or more of the following: a metal, aluminum (Al), a hardened Al alloy, Titanium (Ti), a Titanium Alloy or Nickel (Ni).

3. A device, as in claim 1, where the cathode structure comprises:

a dielectric separator, the dielectric separator being ionically conducting for ions and electrically insulating for electrons;

a cathode disposed on and adhering to the dielectric separator; and a conductive layer disposed on the cathode, electrically connecting the cathode and conductive contact.

4. A device, as in claim 3, where the dielectric separator is a woven fabric polymer material made from one of the following: Polyacrylnitrile (PAN), a quarternized polysulfone membrane, an electrospun Polyvinylidene fluoride, and a methylmethacrylate (MMA) polyethylene (PE) composite.

5. A device, as in claim 1, where the conductive adhesive layer covers each of the legs.

6. A device, as in claim 1, where the conductive adhesive layer electrically connects to an external contact.

7. A device, as in claim 1, where the cathode contact has a single leg and a T shape.

8. A device, as in claim 1, where the cathode structure comprises a cathode made of Lithium Manganese Oxyfluoride, with the approximate stoichiometry of $Li_2MnO_2F$, (LMOF) m combination with a solid polymer electrolyte (SPE) material.

9. A device, as in claim 1, where the conductive adhesive layer is between the cathode contact and the electrically insulating layers covering the sides of the trench above the cathode structure.

10. A device, as in claim 1, where the cathode contact is a pi-shape, with the pi-shape having two legs, a pi-shape top, and a cathode space between the two legs, the two legs being within the trench and the cathode structure being disposed in the cathode space.

11. A device, as in claim 10, where the cathode structure comprises:

a conductive layer disposed between the two legs of the pi-shaped cathode contact, electrically connecting the cathode and cathode contact;

a cathode disposed on the conductive layer between the two legs of the pi-shaped cathode contact; and a dielectric separator adhered to the cathode surface, the dielectric separator being ionically conducting for ions and electrically insulating for electrons, the dielectric separator electrically separating the two legs and the cathode from the electrolyte.

12. A device, as in claim 11, further comprising an adhesive layer covering the outside of the two legs of the pi-shaped cathode contact where the adhesive layer completely sealing the pi-shaped cathode contact to the sidewalk of the trench; and where the adhesive resides between the top contact and the top surface/field of the trench substrate completely sealing the anode, electrolyte, and cathode structure within the trench.

* * * * *